United States Patent [19]

McShane et al.

[11] Patent Number: 5,049,526

[45] Date of Patent: Sep. 17, 1991

[54] METHOD FOR FABRICATING SEMICONDUCTOR DEVICE INCLUDING PACKAGE

[75] Inventors: Michael B. McShane; Paul T. Lin, both of Austin, Tex.

[73] Assignee: Motorola, Inc., Schaumburg, Ill.

[21] Appl. No.: 362,644

[22] Filed: Jun. 7, 1989

[51] Int. Cl.$^5$ ............................................. H01L 23/2
[52] U.S. Cl. ................................... 437/211; 437/214; 264/272.14; 174/52.5
[58] Field of Search ............... 437/211, 214, 927, 207, 437/217, 219; 264/272.17; 174/52.5

[56] References Cited

U.S. PATENT DOCUMENTS

| 3,627,901 | 12/1971 | Happ | 437/217 |
| 3,942,245 | 3/1976 | Jackson et al. | 437/207 |
| 3,982,317 | 9/1976 | Eysermans | 437/926 |
| 4,026,008 | 5/1977 | Drees et al. | 437/211 |
| 4,701,999 | 10/1987 | Palmer | 437/211 |
| 4,859,631 | 8/1989 | Barre | 437/218 |

FOREIGN PATENT DOCUMENTS

| 58-190047 | 5/1983 | Japan | 437/211 |
| 59-143334 | 8/1984 | Japan | 437/211 |
| 63-226031 | 9/1988 | Japan | 437/207 |

Primary Examiner—Olik Chaudhuri
Assistant Examiner—Andrew Griffis
Attorney, Agent, or Firm—Jasper W. Dockrey; John A. Fisher

[57] ABSTRACT

A method for fabricating and especially for encapsulating a semiconductor device in a plastic package is disclosed. In accordance with one embodiment of the invention the method includes steps of providing an encapsulation mold having a first chamber and a second chamber, with the second chamber spaced outwardly from and substantially surrounding the first chamber. The first chamber is shaped to receive a removable insert. An insert is selected for the particular body type and style which is desired and that insert is secured in the first chamber. The insert has a cavity which is shaped to define the desired encapsulated device package body. A lead frame is provided including a bonding area and a plurality of leads, each lead having a inner portion near the bonding area and an outer portion extending outwardly from the bonding area. A semiconductor device die is secured to the lead frame and the lead frame with the die attached is aligned within the encapsulation mold to place the semiconductor device die and the inner ends of the leads within the cavity defined by the inserts. The outer ends of the leads extend through the second chamber. Plastic material is then injected into the mold to form the device package body about the semiconductor device die. The package body is shaped by the cavity and the inserts and the carrier ring is shaped by the second chamber.

7 Claims, 3 Drawing Sheets

METHOD FOR FABRICATING SEMICONDUCTOR DEVICE INCLUDING PACKAGE

BACKGROUND OF THE INVENTION

This invention relates generally to the fabrication of semiconductor devices, and more particularly to the fabrication and encapsulation of semiconductor devices using a composite mold with selectable inserts.

Semiconductor devices are often encapsulated in a protective plastic body from which a plurality of leads extend to allow electrical contact and interconnection with the encapsulated semiconductor device itself. The protective plastic body is formed by injecting plastic into a mold which surrounds each of a plurality of individual devices and associated leads. The molds which are used to form the plastic packages are very expensive to produce, in part because they must be machined from extremely hard materials such as tool steels, tungsten carbides, and the like. Additionally, the molds themselves are difficult to machine, including very small details which must be precisely implemented. The extremely hard materials are necessary to withstand the abrasive quality of the plastic encapsulating materials. Even the hard materials used for the molds, however, show signs of wear after repeated molding operations. This wear is especially severe along the gates through which the plastic flows as it passes from a source of supply to the individual device sites.

The expense of making the molds argues against proliferation of mold types and also against experimenting with new designs. Despite this, the need for new and complex package types and for expensive new molds to fabricate each of the new packages is ever increasing. As the complexity of the semiconductor device increases, the number of leads necessary for contact and interconnection increases. With the very complex integrated circuit functions presently being implemented in a single packaged device, the number of leads has increased to tens and even hundreds of leads on each device package. The many device leads must be maintained in precise shape, position, and alignment so that the packaged device can be reliably affixed to a printed circuit board or other application. During testing, handling, and other operations there is a high probability that one or more of the large plurality of leads will become bent, misaligned, or moved out of planarity with the other leads. One solution to this problem has been to use a molded carrier ring with the device. A molded carrier ring is a protective ring surrounding and spaced apart from the package body which is molded around and supports the ends of the leads while providing means for contacting those leads for testing and the like. After the testing and most of the handling has been completed, the molded ring is excised from the lead frame and the leads are cut and formed to their desired, finished form. This cutting and shaping is done at a point in time that is close to the time when the device will actually be placed in operation so that little additional handling must be done. The possibility of misaligning the leads is therefore significantly reduced and the yield to the assembly operation is appreciably enhanced.

The semiconductor industry is beginning to standardize on a limited number of carrier ring configurations. A large number of package types will be accommodated with a limited and much smaller number of ring configurations. A variety of different packages will use the same ring configuration so that a large proliferation of handling equipment will be avoided. This means that a limited number of handler, tester, and other equipment variations are needed to accommodate a large number of package types.

As the concept of molded carrier rings spreads through the industry and replaces a number of existing, non-carrier ring configurations, and as new applications arise, new molds must be generated for each of the new package types and to replace those molds which have excessive wear. This is a very expensive and time consuming endeavor. A need existed, therefore, for a method for fabricating semiconductor devices and especially for the packaging thereof in carrier ring configurations which would reduce the cost of the molding operation, would provide flexibility, and would reduce the cycle time for implementing new package designs.

It is therefore an object of this invention to provide an improved process for the fabrication of semiconductor devices.

It is another object of this invention to provide an improved process for the fabrication and packaging of semiconductor devices in a carrier ring configuration.

It is yet another object of this invention to provide an improved process for fabricating semiconductor devices which allows for the changing of design or for the refurbishing of mold gates.

It is a still further object of this invention to provide an improved and flexible method for the fabrication and encapsulation of semiconductor devices.

BRIEF SUMMARY OF THE INVENTION

The foregoing and other objects and advantages of the invention are achieved through an improved process in which a standardized mold is adapted to receive inserts to customize or repair the mold. For example, in accordance with one embodiment of the invention, a mold including a standardized ring configuration is customized for individual package types. In accordance with one particular embodiment of the invention, an encapsulation mold is provided which has first and second chambers in which the second chamber is outwardly spaced from and substantially surrounds the first chamber and defines the shape of the carrier ring to be molded. The first chamber is adapted to receive an interchangeable insert. The interchangeable insert has a cavity shape to define a selected encapsulated device package body. A lead frame including a bonding area and a plurality of leads extending outwardly from the bonding area is provided, and a semiconductor device die is secured to that lead frame. The lead frame with the die secure thereto is aligned in the encapsulation mold to place the semiconductor device die and the inner ends of the leads within the insert cavity and with the outer ends extending through the second chamber. A plastic material is then injected into the mold to form a device package body shaped by the insert cavity about the semiconductor device die and a carrier ring about the outer portion of the leads shaped by the second chamber.

DETAILED DESCRIPTION OF PREFERRED EMBODIMENTS

Figure 1:
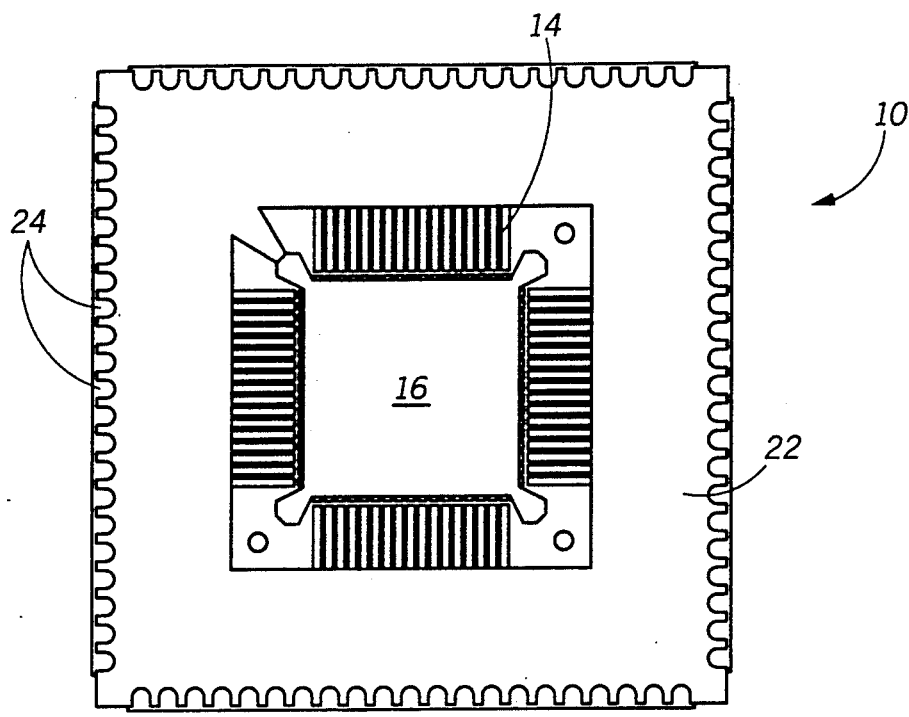
FIGS. 1 and 2 illustrate, in plan view, different semiconductor device package configurations each using a standardized carrier ring structure.
Figure 2:
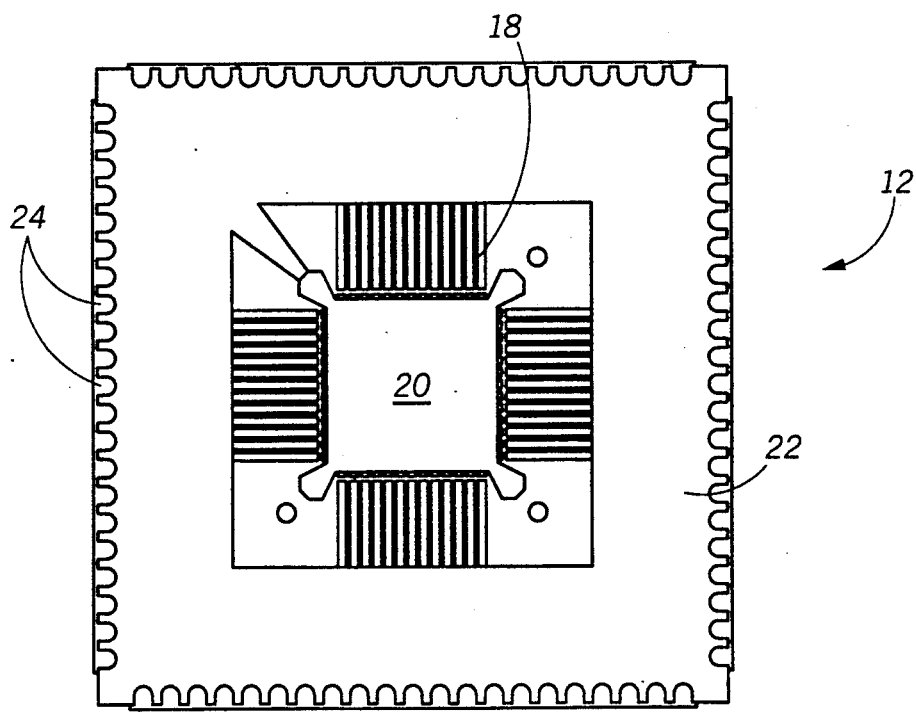

FIGS. 1 and 2 illustrate, in plan view, semiconductor devices 10 and 12, respectively. Device 10 is a 68 lead plastic encapsulated integrated circuit. The 68 leads 14 are arranged in a quad flat pack arrangement with a 25 mil lead pitch. The leads are symmetrically arranged with 17 of the leads extending outwardly from each side of the package body 16.

Similarly, device 12 is a 52 lead plastic encapsulated integrated circuit device. The leads 18 are again arranged symmetrically, with 13 leads extending outwardly from each side of the package body 20.

In each of the devices 10, 12, a molded carrier ring 22 is spaced outwardly from and surrounds the package body. Each of the rings 22 uses the same configuration. Each ring is provided with a total of 84 test point locations 24 symmetrically distributed about the outside edge of the ring. The ring size and the number and placement of test point locations is the same for each package. The same ring configuration is used despite the fact that device 10 has 68 leads and device 12 has 52 leads. Not all of the test point locations are used with either of these package types, and less test point locations are used with package 12 than are used with package 10. The lead frame appropriate for a particular package type includes outer lead portions which extend outwardly and terminate at the test point locations. Because the test rings are identical for the two devices, the same handling and testing equipment can be used for each device. This ring can be used for any package type having 84 or less leads, providing that those leads are reasonably symmetrically distributed. Without the standardized carrier ring, different handling and testing equipment would be required for each different device type.

Figure 3:
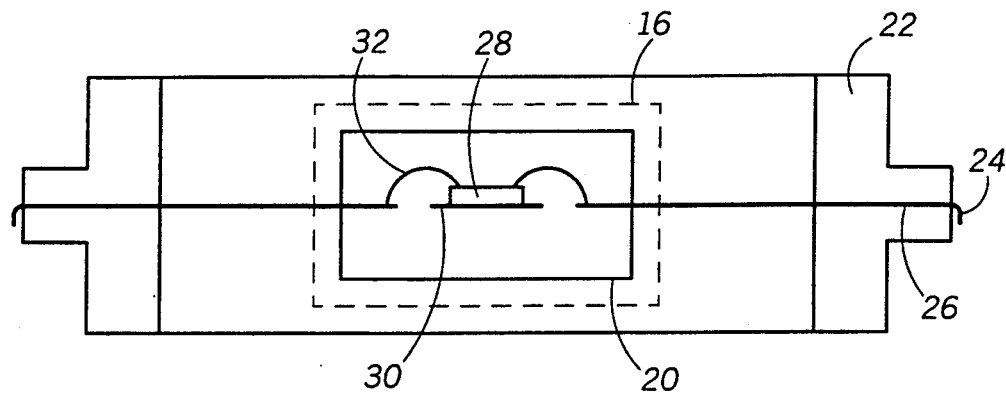
FIG. 3 illustrates, in cross-section, a semiconductor device package and carrier ring.

FIG. 3 illustrates a cross-section through either of the devices illustrated in FIGS. 1 and 2 above. Illustrated in FIG. 3 is one embodiment of the carrier ring structure 22. The carrier ring surrounds a package body 20, or alternatively a package body 16 is shown by the dashed lines. This illustrates that the same carrier ring is used to accommodate various package body sizes.

A lead frame 26 extends through the package body and carrier ring and terminates in test point locations 24. A semiconductor device 28 is bonded to the bonding area 30 of lead frame 26. Fine wires 32 interconnect semiconductor device 28 with individual ones of the lead of lead frame 26.

Figure 4:
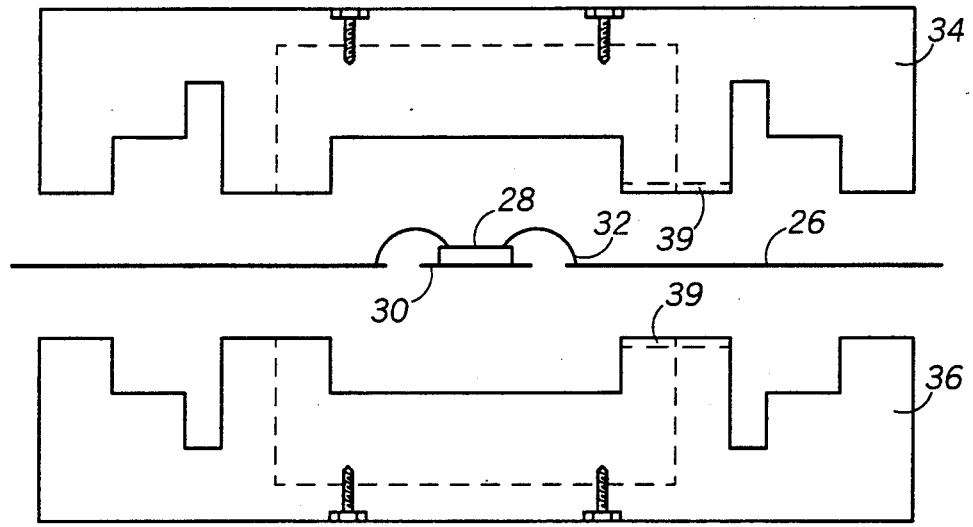
FIGS. 4 and 5 illustrates, in cross-section, one embodiment of a mold structure for use in carrying out the process in accordance with the invention.

FIG. 4 illustrates a semiconductor device and one embodiment of a plastic encapsulation mold which is used to fabricate and package such a device in accordance with the invention. A semiconductor device die 28 is mounted to the bonding area 30 of a lead frame 26. A plurality of leads 32 are bonded between the semiconductor device die 28 and the individual leads of lead frame 26. The lead frame is placed within a plastic encapsulation mold which, in this embodiment, includes upper portion 34 and lower portion 36. Lead frame 26 is properly aligned with the mold portions, usually by a series of alignment holes and keys (not shown).

Figure 5:
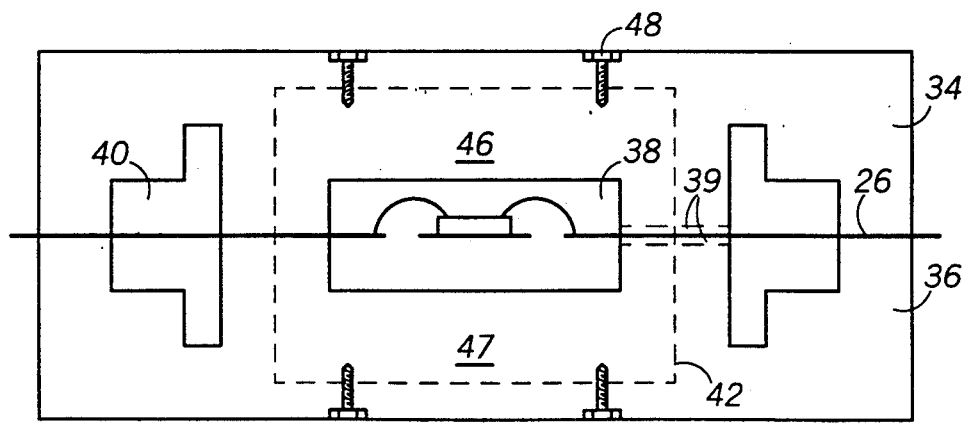

The two halves of the plastic encapsulation mold are brought together to clamp on the lead frame as illustrated in FIG. 5. The two mold halves 34, 36 are brought together to define a first cavity 38 and a second cavity 40. First cavity 38 provides an encapsulation mold which defines the package body. Second cavity 40 provides an encapsulation mold for a protective carrier ring which is spaced apart from and surrounds the package body cavity 38. A gate 39 provides for the flow of plastic encapsulation material between cavities 38 and 40.

The second cavity is fixed, and provides a standard carrier ring which is common to a number of different package body types. In accordance with the invention, first cavity 38 can be changed to accommodate a variety of different package body types, each with the same carrier ring structure. To change cavity 38 to mold a different plastic package body, the encapsulation mold is constructed with opposing chamber 42 in each of the mold halves. These chambers are designed to accept an insert or, in this embodiment, a pair of inserts 46, 47, one in each of the mold halves 34, 36. The inserts fit snugly into chambers 42 and may be held in place by screws 48 or the like. The inserts, in turn, define the interior cavity space 38.

To encapsulate a semiconductor device in accordance with the invention, inserts are selected, depending upon the package body type desired, and these inserts are positioned in and secured in mold halves 34 and 36. The mold halves are closed about lead frame 26 with the semiconductor die attached thereto and plastic material is injected or transferred into the interior spaces formed by the two mold halves. The filling plastic forms the plastic package body portion and the molded carrier ring surrounding the body portion. A different package body can be accommodated simply by changing the mold inserts 46, 47 without requiring the manufacture of an entire new encapsulation mold.

Figure 6:
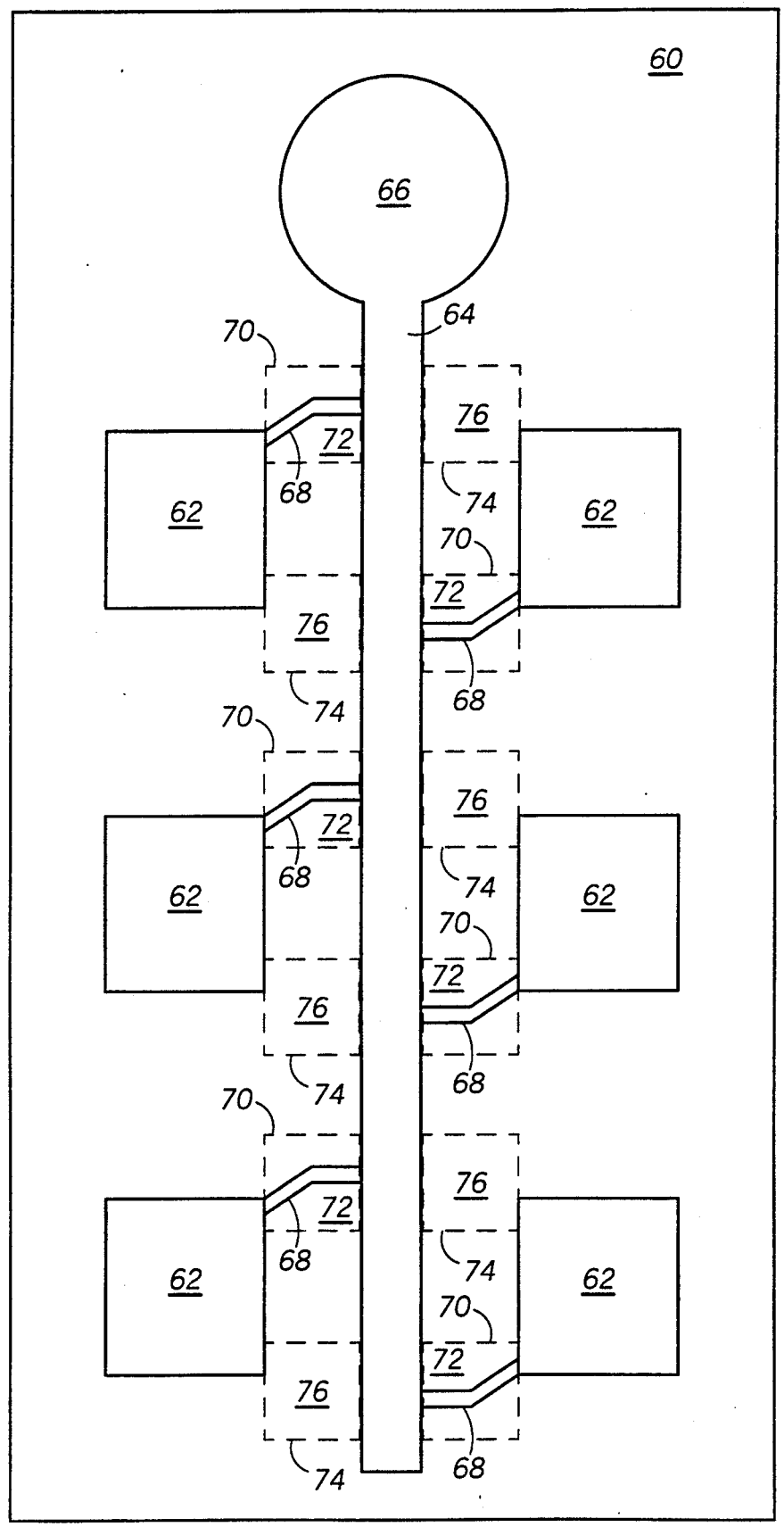
FIG. 6 illustrates, in top view, an encapsulation mold half used in a process in accordance with a further embodiment of the invention.

The foregoing described embodiments relate to the fabrication of a semiconductor device including a plastic body and a surrounding plastic carrier ring. A further embodiment of the process in accordance with the invention involves the use of an encapsulation mold, one half of which is illustrated in FIG. 6, which can be adapted and/or repaired, as needed, and which can be used in the encapsulation of semiconductor devices with or without a carrier ring. In the encapsulation of semiconductor devices, with or without a carrier ring, it is usual to simultaneously encapsulate a plurality of devices in the same mold and in the same molding operation. FIG. 6 illustrates, in top view, a mold half 60 for use in the encapsulation molding of 6 semiconductor devices. For illustrative purposes, this embodiment of the invention is explained with reference to a mold used for the encapsulation of a device without a carrier ring. The mold half includes cavities 62 for forming each of the 6 semiconductor device bodies. A runner 64 provides for the flow of the plastic encapsulation material from a reservoir or source 66 to each of the cavities. For each of the cavities 62, the plastic flows through a gate 68 from the runner 64. The mold gates are often the first portion of the mold to show signs of wear from the abrasive nature of the plastic encapsulation material. Excessive wear of the mold gates eventually requires the replacement of the mold, at great expense. In accordance with the invention, the gates are made as replaceable inserts which can be replaced as they wear out. As illustrated by the dashed lines 70, a cavity is provided in mold half 60 into which an insert 72 is fitted. Insert 72 provides the gate which allows the plastic encapsulation material to flow from runner 64 into cavity 62. In addition to allowing repair and replacement of the gate, the use of insert 72 allows the gate to be modified, as different gates can be substituted by changing the insert. Further, in accordance with the invention, the location of the gate, or any other feature of the mold can be changed by providing a cavity into which a replaceable insert can be fitted. For example, a cavity indicated by dashed line 74 provides for a gate at a different location. If no gate is desired at that location, a blank insert 76 can be fitted into that cavity. In this manner, the optimum gating of the mold can be determined experimentally without requiring a plurality of expensive molds. Gates (not illustrated in this embodiment) are also used to allow the flow of plastic encapsulating material between the carrier ring and the package body for those semiconductor devices which use a carrier ring. For example, for a device which has a carrier ring, the plastic encapsulation material often flows along the runner, through a first gate to the carrier ring, and then through a second gate to the package body.

Thus it is apparent that there has been provided, in accordance with the invention, a method for fabricating a semiconductor device and especially for the encapsulation of a semiconductor device having a molded carrier ring which fully meets the objects and advantages set forth above. Although the invention has been described and illustrated with reference to specific embodiments thereof, it is not intended that the invention be limited to these illustrative embodiments. For example, different mold configurations are considered within the scope of the invention. The mold described herein has been merely illustrative of the type of mold actually used in encapsulating a semiconductor device. Further, in actual operation the lead frame usually provides for a plurality of semiconductor devices to be mounted along a lead frame strip. The mold used for encapsulating this plurality of semiconductor devices thus includes a plurality of sets of chambers, each set designed to provide a package body and, if desired, a surrounding carrier ring. The number of chambers used in a mold can be varied, as can the numbers of gates. It is intended to encompass within the invention all such variations and modifications as fall within the scope of the appended claims.

We claim:

1. A method for encapsulating a semiconductor device including a package body portion and a molded carrier ring surrounding the body portion, the method comprising the steps of:
    providing a mold having a first cavity for defining a carrier ring shape and a second cavity for accepting an insert;
    providing an insert for said second cavity of said mold for customizing said second cavity, said insert having a cavity shaped to define a package body;
    providing a lead frame;
    attaching a semiconductor device die to said lead frame;
    inserting said lead frame with said die attached thereto into said mold; and
    filling plastic into said mold including said cavity in said insert to form a plastic body portion encapsulating said die and a plastic carrier ring surrounding said body portion.

2. The method of claim 1 wherein said step of providing a mold further includes the step of providing a mold having a gate extending from said first cavity to said second cavity.

3. The method of claim 2 wherein the step of providing a mold having a gate comprises providing a mold having a third cavity for accepting a second insert; and providing a second insert for said third cavity for defining a gate between said first and second cavities.

4. The method of claim 1 wherein said step of providing an insert comprises providing an insert defining a package body shape having a quad flat pack configuration.

5. A method for encapsulating a semiconductor device in a plastic package comprising the steps of:
    providing an encapsulation mold having a first chamber and a second chamber, said second chamber outwardly spaced from and substantially surrounding said first chamber, said first chamber shaped to receive a removable insert;
    securing an insert into said first chamber, said insert having a cavity shaped to define an encapsulated device package body;
    providing a leadframe including a bonding area and a plurality of leads having an inner portion near said bonding area and an outer portion extending outwardly from said bonding area;
    securing a semiconductor device die to said leadframe;
    aligning said leadframe having said semiconductor die secured thereto in said encapsulation mold to place said semiconductor device die and the inner ends of said leads within said cavity and said outer ends extending through said second chamber; and
    filling a plastic material into said mold including said cavity in said insert to form said device package body about said semiconductor device die and shaped by said cavity in said insert and a carrier ring about said outer portion and shaped by said second chamber.

6. A method for encapsulating semiconductor devices including a plastic body portion comprising the steps of:
    providing a mold having a plurality of first cavities each for defining a plastic body shape, a runner for conveying plastic encapsulating material, and a plurality of second cavities for accepting inserts;
    providing a plurality of inserts for said plurality of second cavities, said inserts configured to provide gates for conveying plastic encapsulating material from said runner to said plurality of first cavities;
    fitting said plurality of inserts into said plurality of second cavities to define paths for plastic encapsulating material from said runner into said plurality of first cavities;
    providing a lead frame having a plurality of device locations;
    attaching a plurality of semiconductor device die to said lead frame, one semiconductor device die at each of said device locations;
    inserting said lead frame with said plurality of semiconductor device die attached thereto into said mold; and
    filling plastic encapsulating material into said mold to form a plastic body portion encapsulating each of said plurality of semiconductor device die.

7. The method of claim 6 further comprising the step of providing a third cavity and a third insert for said cavity, said third insert designed to modify said mold.

* * * * *